United States Patent
Heisen et al.

(10) Patent No.: US 8,294,032 B2
(45) Date of Patent: Oct. 23, 2012

(54) METHOD AND APPARATUS FOR ALIGNING AND INSTALLING FLEXIBLE CIRCUIT INTERCONNECTS

(75) Inventors: Peter Timothy Heisen, Kent, WA (US); Harold Peter Soares, Jr., Tacoma, WA (US)

(73) Assignee: The Boeing Company, Chicago, IL (US)

( * ) Notice: Subject to any disclaimer, the term of this patent is extended or adjusted under 35 U.S.C. 154(b) by 1 day.

(21) Appl. No.: 12/703,477

(22) Filed: Feb. 10, 2010

(65) Prior Publication Data
US 2011/0024161 A1 Feb. 3, 2011

Related U.S. Application Data

(63) Continuation of application No. 11/763,879, filed on Jun. 15, 2007, now Pat. No. 7,690,107.

(51) Int. Cl.
*H05K 1/00* (2006.01)

(52) U.S. Cl. ............................................. 174/254

(58) Field of Classification Search .................. 174/250, 174/253, 254, 260; 361/386, 749, 784, 803, 361/728, 733, 748, 767, 774, 776–777, 789
See application file for complete search history.

(56) References Cited

U.S. PATENT DOCUMENTS

| | | | |
|---|---|---|---|
| 4,489,999 A * | 12/1984 | Miniet | 439/67 |
| 4,554,505 A | 11/1985 | Zachry | |
| 5,019,829 A | 5/1991 | Heckman et al. | |
| 5,163,837 A | 11/1992 | Rowlette, Sr. | |
| 5,219,137 A | 6/1993 | Stepanek et al. | |
| 5,276,455 A | 1/1994 | Fitzsimmons et al. | |
| 5,468,996 A | 11/1995 | Chan et al. | |
| 5,745,346 A | 4/1998 | Ogawa et al. | |
| 5,777,855 A * | 7/1998 | Yokajty | 361/803 |
| 5,886,671 A | 3/1999 | Riemer et al. | |
| 5,917,709 A | 6/1999 | Johnson et al. | |
| 6,020,848 A | 2/2000 | Wallace et al. | |
| 6,271,728 B1 | 8/2001 | Wallace et al. | |
| 6,424,313 B1 | 7/2002 | Navarro et al. | |
| 6,469,671 B1 | 10/2002 | Ploymers et al. | |
| 6,469,909 B2 | 10/2002 | Simmons | |

(Continued)

FOREIGN PATENT DOCUMENTS

JP 62105501 A 5/1987

(Continued)

OTHER PUBLICATIONS

McIlvenna et al., "EHF Monolithic Phased Arrays—A Stepping-Stone to the Future", Military Communications Conference, 1988 IEEE, vol. 3, Oct. 23-26, 1988, San Diego, CA, US, pp. 731-735.

(Continued)

*Primary Examiner* — Timothy Thompson
*Assistant Examiner* — Tremesha S Willis
(74) *Attorney, Agent, or Firm* — Yee & Associates, P.C.

(57) ABSTRACT

A method and apparatus for aligning components on a module are disclosed. A flexible circuit may be attached to a module in which a tooling apparatus is attached to the module. A plurality of circuit pads on a functional section of the flexible circuit is aligned by a first alignment structure located on a sacrificial portion of the flexible circuit to a second alignment structure on the tooling apparatus. The flexible circuit is attached to the module while the flexible circuit is in an aligned position.

15 Claims, 11 Drawing Sheets

U.S. PATENT DOCUMENTS

| | | | |
|---|---|---|---|
| 6,670,930 | B2 | 12/2003 | Navarro |
| 6,768,471 | B2 | 7/2004 | Bostwick et al. |
| 6,900,765 | B2 | 5/2005 | Navarro et al. |
| 6,989,791 | B2 | 1/2006 | Navarro et al. |
| 7,187,342 | B2 | 3/2007 | Heisen et al. |
| 7,342,801 | B2 | 3/2008 | Jandzio et al. |
| 7,388,756 | B1 | 6/2008 | Worl et al. |
| 7,436,679 | B2 | 10/2008 | Iijima et al. |
| 7,446,261 | B2 | 11/2008 | Kumar et al. |
| 7,515,013 | B2 | 4/2009 | O'Connell et al. |
| 7,580,003 | B1 | 8/2009 | Davis et al. |
| 7,629,538 | B2 | 12/2009 | Heisen et al. |
| 7,690,107 | B2 | 4/2010 | Heisen et al. |
| 7,782,268 | B2 | 8/2010 | Carroll et al. |
| 7,868,830 | B2 | 1/2011 | Worl et al. |
| 7,884,768 | B2 | 2/2011 | Navarro et al. |
| 7,889,135 | B2 | 2/2011 | Blaser et al. |
| 2002/0089835 | A1 | 7/2002 | Simmons |
| 2003/0002265 | A1 | 1/2003 | Simmons |
| 2003/0103739 | A1* | 6/2003 | Brezina et al. .................. 385/93 |
| 2005/0017904 | A1 | 1/2005 | Navarro et al. |
| 2005/0219137 | A1 | 10/2005 | Heisen et al. |
| 2005/0243527 | A1 | 11/2005 | Jandzio et al. |
| 2006/0109366 | A1* | 5/2006 | Humpston et al. ............ 348/340 |
| 2006/0152414 | A1 | 7/2006 | Peshlov et al. |
| 2006/0202312 | A1 | 9/2006 | Iijima et al. |
| 2007/0001919 | A1 | 1/2007 | Carroll et al. |
| 2008/0106484 | A1 | 5/2008 | Navarro et al. |
| 2008/0110020 | A1 | 5/2008 | Heisen et al. |
| 2008/0310125 | A1 | 12/2008 | Heisen et al. |
| 2008/0316139 | A1 | 12/2008 | Blaser et al. |
| 2009/0284415 | A1 | 11/2009 | Worl et al. |
| 2011/0068993 | A1 | 3/2011 | Worl et al. |

FOREIGN PATENT DOCUMENTS

| | | |
|---|---|---|
| WO | 9723923 A | 7/1997 |

OTHER PUBLICATIONS

Robert J. Mailloux, "Antenna Array Architecture", Proceeding of the IEEE, New York, US, vol. 80, No. 1, Jan. 1992, pp. 163-172.

USPTO office action for U.S. Appl. 11/765,332 dated Apr. 2, 2010.

USPTO Notice of allowance for U.S. Appl. No. 12/119,865 dated Oct. 19, 2010.

USPTO Notice of allowance for U.S. Appl. No. 11/765,332 dated Sep. 1, 2010.

USPTO Office Action regarding U.S. Appl. No. 11/763,879, dated Mar. 6, 2009, 10 pages.

USPTO Response to Office Action regarding U.S. Appl. No. 11/763,879, dated Jun. 2, 2009, 12 pages.

USPTO Ex Parte Office Action regarding U.S. Appl. No. 11/763,879, dated Aug. 7, 2009, 7 pages.

USPTO Response to Ex Parte Office Action regarding U.S. Appl. No. 11/763,879, dated Oct. 5, 2009, 5 pages.

USPTO Notice of Allowance regarding U.S. Appl. No. 11/763,879, dated Nov. 25, 2009, 11 pages.

USPTO Notice of Allowance regarding U.S. Appl. No. 11/765,332, dated Oct. 29, 2010, 6 pages.

* cited by examiner

METHOD AND APPARATUS FOR ALIGNING AND INSTALLING FLEXIBLE CIRCUIT INTERCONNECTS

This application is a continuation of application Ser. No. 11/763,879, filed Jun. 15, 2007, issued as U.S. Pat. No. 7,690,107.

This invention was made with U. S. Government support under Contract No. N00014-02-C-0068 awarded by the United States Navy. The government has certain rights in this invention.

BACKGROUND INFORMATION

1. Field

The present invention relates generally to electronic circuits and in particular to a method and apparatus for manufacturing electronic circuits. Still more particularly, the present invention relates to a method and apparatus for aligning and installing flexible circuit interconnects and other components in a module.

2. Background

Flexible electronics is a technology for building electronic circuits in which electronic devices may be placed or deposited on flexible substrates, such as plastic. Flexible electronics are also referred to as "flex circuits" or "flexible circuits". In some cases, flexible circuits may be made by using the same components used for rigid printed circuit boards, but changing the substrate to a flexible substrate.

Flexible circuits often are used as connectors in various applications. These circuits are used when flexibility, space savings, or production constraints limit the use of rigid circuit boards or hand wiring. As modules decrease in size, the use of flexible circuits to make interconnects becomes more difficult. Typically, alignment pins have been included as part of a module or circuit to position and install flexible circuits on modules. This use of pins as an alignment feature has been incorporated into three dimensional packaging architectures for radio frequency antenna modules. As the size of modules decrease, the amount of room present is often not sufficient to use alignment pins.

For example, in some instances, a flexible circuit may need to be aligned to a module within several one thousandths of an inch in three different dimensions. Consequently, any use of alignment pins that would fit in available real estate in a module would be too small for most hand assemblies.

SUMMARY

The advantageous embodiments provide a method and apparatus for aligning components on a module. A flexible circuit may be attached to a module in which a tooling apparatus is attached to the module. A plurality of circuit pads on a functional section of the flexible circuit is aligned by a first alignment structure located on a sacrificial portion of the flexible circuit to a second alignment structure on the tooling apparatus. The flexible circuit is attached to the module while the flexible circuit is in an aligned position.

In another advantageous embodiment, a flexible circuit is attached to a structure. A first feature in a functional section of the flexible circuit is aligned to a second feature on the structure using a sacrificial section on the flexible circuit to align the first feature to the second feature, wherein the flexible circuit is in an aligned position. The flexible circuit is affixed to the structure while the flexible circuit is in the aligned position.

In a further advantageous embodiment, a flexible circuit has a functional section and a sacrificial section. The sacrificial section includes alignment features.

The features, functions, and advantages can be achieved independently in various embodiments of the present invention or may be combined in yet other embodiments in which further details can be seen with reference to the following description and drawings.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an advantageous embodiment of the present invention when read in conjunction with the accompanying drawings, wherein:

DETAILED DESCRIPTION

Figure 1:
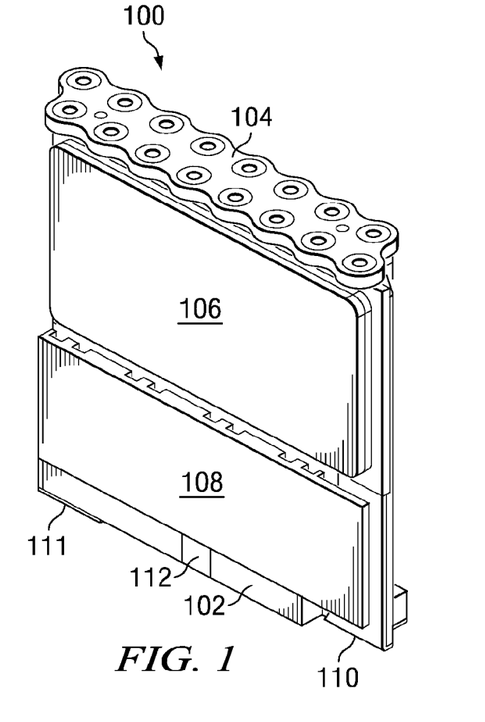
FIG. 1 is a diagram illustrating a module in which alignment and installation of flexible circuit interconnects and other components may be performed in accordance with an advantageous embodiment.
Figure 2:
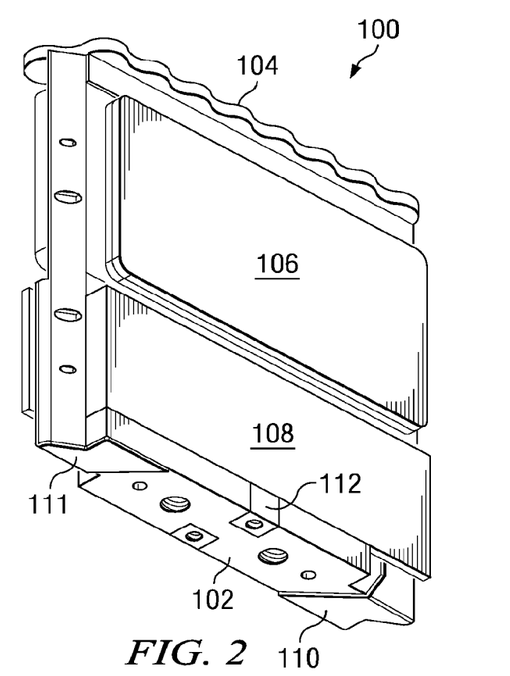
FIG. 2 is a bottom view of a diagram illustrating a module in which alignment and installation of flexible circuit interconnects and other components may be performed in accordance with an advantageous embodiment.

With reference now to the figures, and in particular with reference to FIG. 1, a diagram illustrating a module in which the alignment and installation of flexible circuit interconnects and other components may be performed is depicted in accordance with an advantageous embodiment. In this example, module 100 is a radio frequency module used in an antenna. Module 100 contains mandrel 102, which is a structure on which different components are put together to form module 100. In these examples, antenna integrated printed wiring board (AIPWB) 104, ceramic package assembly 106, grounding cover 108, flexible circuit 110, flexible circuit 111 and edge launch connector 112 are assembled on mandrel 102 to form module 100. Next, FIG. 2 is a bottom view of module 100 in these examples.

Figure 3:
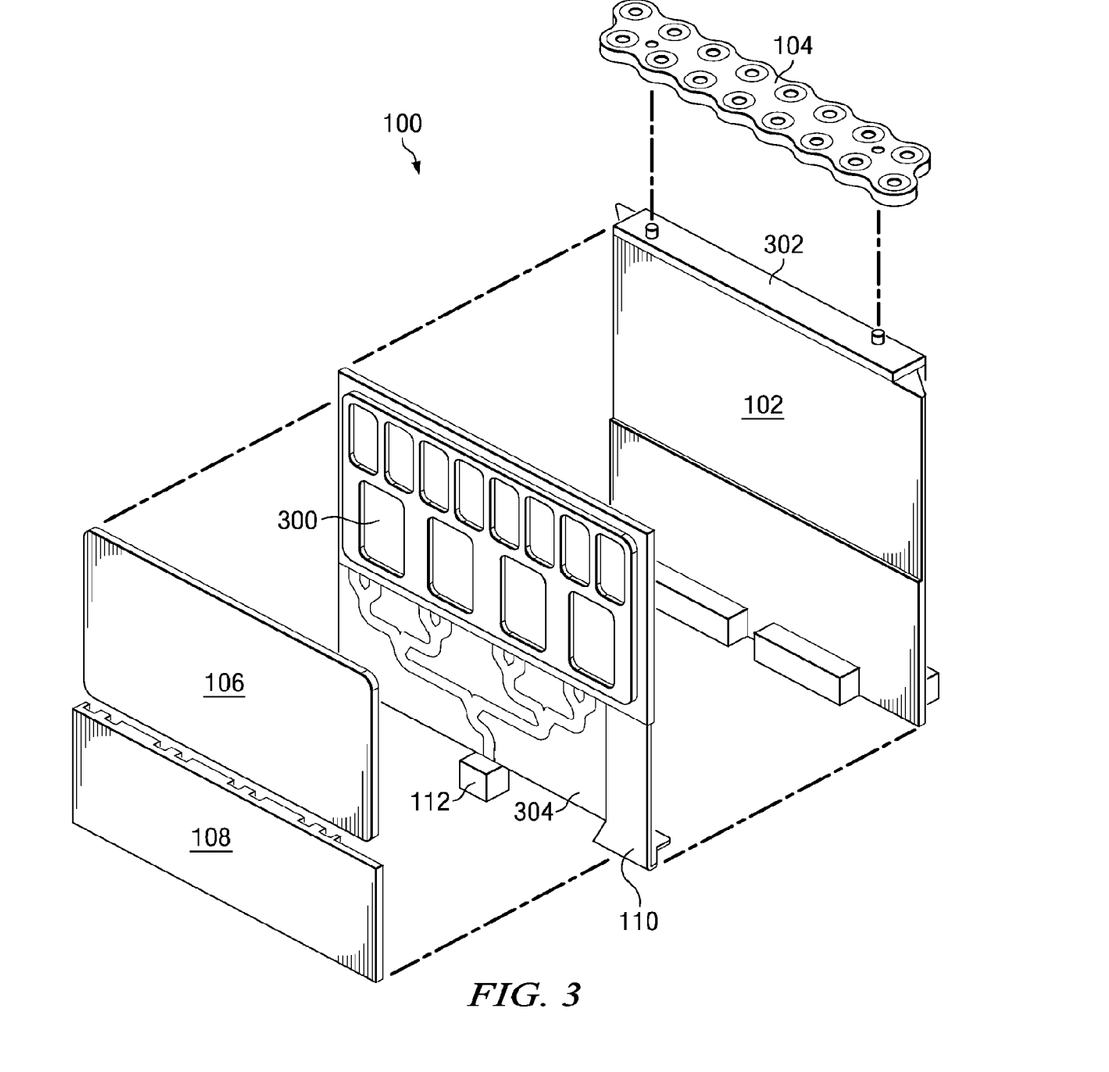
FIG. 3 is a diagram illustrating an exploded view of a module in accordance with an advantageous embodiment.

With reference now to FIG. 3 a diagram illustrating an exploded view of a module is depicted in accordance with an advantageous embodiment. Module 100 is shown in an exploded view in which other components can be seen. Module 100 also includes ceramic package 300, which is covered by lid 106. Microelectronic components are installed in ceramic package 300, including monolithic microwave integrated circuits (MMICs), application specific integrated circuits (ASICs), chip capacitors, chip resistors, wirebonds, and other components. Lid 106 is welded on to ceramic package 300 to form the completed ceramic package assembly. Spacer 302 provides spacing between antenna integrated printed wiring board 104 and mandrel 102. Divider network 304 is adjacent to ceramic package 300.

The different advantageous embodiments may be applied to align and attach different components to form module 100. In these examples, divider network 304 is aligned and attached to mandrel 102. In these examples, divider network 304 may be aligned and attached to mandrel 102 using the different advantageous embodiments. Another example of a component that may be attached using different advantageous embodiments of the present invention is flexible circuit 110. A flexible circuit, such as flexible circuit 110 or flexible circuit 111, may be attached to a module, such as module 100, by attaching an alignment apparatus to the module.

Circuit pads on a functional section of the flexible circuit are aligned using the first alignment structure located in a sacrificial portion of the circuit to a second alignment structure on the alignment apparatus. The flexible circuit may then be attached to the module while the flexible circuit is in the aligned position. In different illustrative embodiments, the flexible circuit has two sections a functional section and a sacrificial section having alignment features. After the flexible circuit has been aligned and attached to the module, the sacrificial section may be removed.

In the different advantageous embodiments, the installation of flexible circuit 110 and flexible circuit 111 onto module 100 may be performed without including alignment pins on module 100. In these examples, flexible circuit 110 includes an adhesive that is screen printed on the back flexible circuit 110. Additionally, flexible circuit 110 may be aligned with the aid of an alignment apparatus (not shown). Once flexible circuits 110 and 111 are in place, the adhesive may be cured. The alignment of flexible circuits 110 and 111 are made in the depicted embodiments using an alignment apparatus. Further, flexible circuits 110 and 111 include a sacrificial section that is removed after flexible circuit 110 is in place and the adhesive has been cured.

Figure 4:
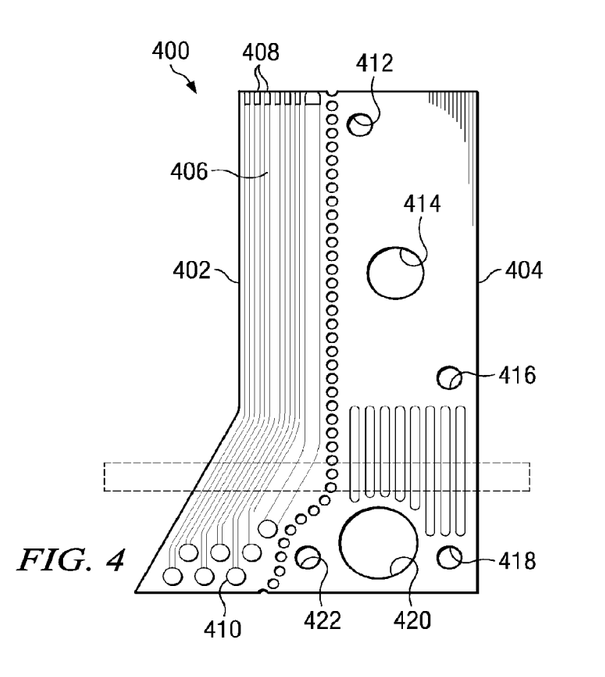
FIG. 4 is a diagram illustrating a layout of a flexible circuit in accordance with an advantageous embodiment.

With reference now to FIG. 4, a diagram illustrating a layout of a flexible circuit is depicted in accordance with an advantageous embodiment. Flexible circuit 400 is an uninstalled example of flexible circuit 110 and 111 in FIG. 1. In this example, flexible circuit 400 includes functional section 402 and sacrificial section 404. In this example, functional section 402 contains traces 406, circuit pads 408, and circuit pads 410, which are used to connect different components to each other. Of course, depending on the particular implementation, functional section 402 also may include devices.

As illustrated, sacrificial section 404 includes alignment holes 412, 414, 416, 418, 420, and 422. These alignment holes are used along with an alignment apparatus to align flexible circuit 400 in the proper location with respect to other components in module 100. These alignment holes are examples of alignment features found on sacrificial section 402 of flexible circuit 400. These alignment features are used to align flexible circuit 400 in the appropriate location on mandrel 102. In this manner, alignment features, such as pins, are not needed on mandrel 102 or elsewhere on module 100.

Circuit pads 408 and circuit pads 410 may be aligned with other circuit pads on the module. In many cases, the alignment of these types of components may require very tight tolerances for proper alignment. For example, circuit pads 408 may have to be aligned to another set of circuit pads on the module within one one-thousandths of an inch. These alignment holes are examples of alignment features found on sacrificial section 402 of flexible circuit 400. These alignment features are ones used to align flexible circuit 400 in the appropriate location on mandrel 102.

Once flexible circuit 400 has been aligned and the adhesive on the back of flexible circuit 400 has been cured, sacrificial section 404 may be removed. In these examples, an epoxy adhesive is selectively screen printed onto the bottom side of flexible circuit 400 in functional section 402. This epoxy adhesive is cured to a "B stage" state. The "B stage" state is a state in which the epoxy adhesive is not fully cured. In this state, the epoxy adhesive assumes a paste form rather than a liquid form and adheres to the bottom of flexible circuit 400.

By not having alignment features in functional section 402, this section of flexible circuit 400 may be made smaller than a flexible circuit that includes alignment features along with functional components. The alignment features in sacrificial section 404 do not require alignment features on mandrel 102. Instead, an alignment apparatus provides the alignment feature in which pins may be placed to align flexible circuit 400 to mandrel 102.

FIGS. 5-15 only illustrate the installation of flexible circuit 110. Flexible circuit 111 may be installed in the same fashion as flexible circuit 110, but is not shown in these examples to avoid complicating the description of the process for aligning components. Thus, only the installation of flexible circuit 110 is illustrated in these examples.

Figure 5:
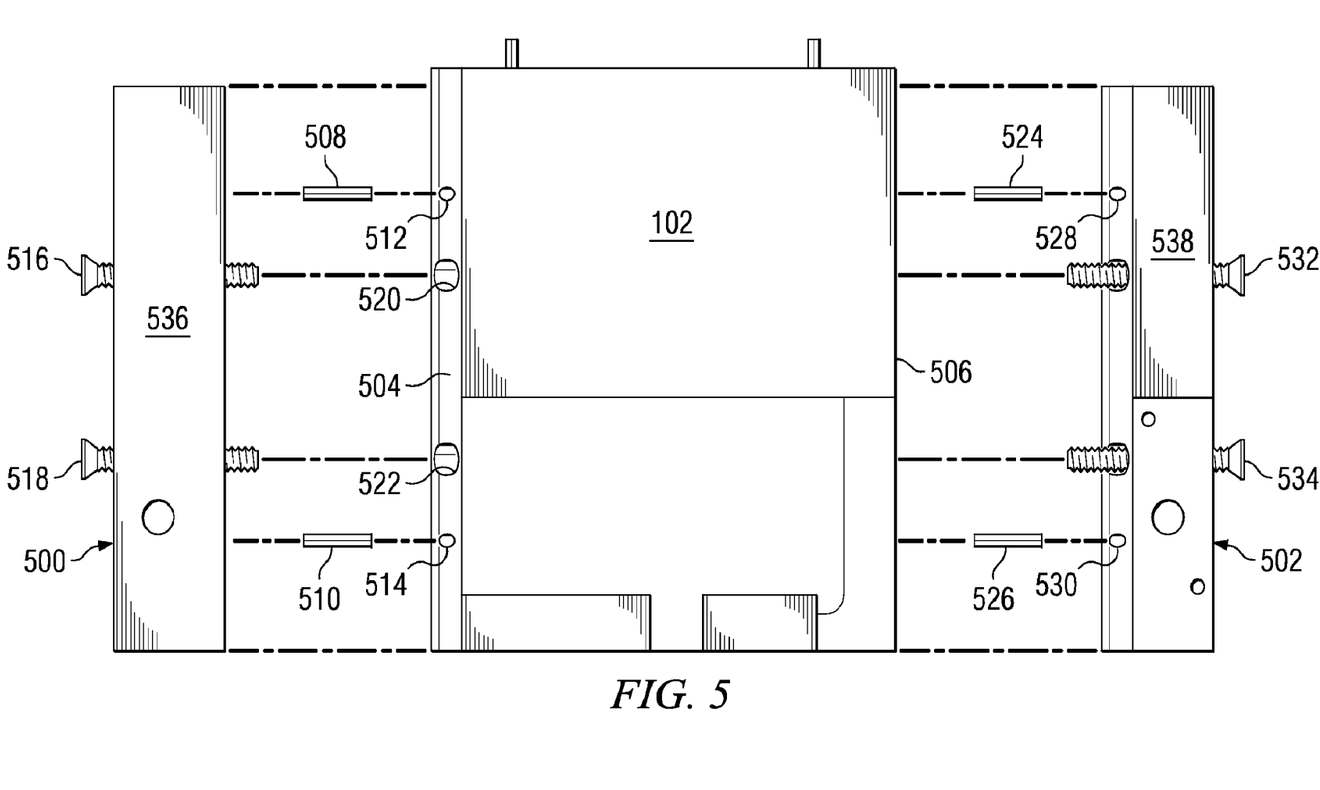
FIG. 5 is a diagram illustrating a portion of an alignment apparatus in accordance with an advantageous embodiment.

Turning now to FIG. 5, a diagram illustrating a portion of an alignment apparatus is depicted in accordance with an advantageous embodiment. In this example, side blocking bars 500 and 502 are placed along side 504 and side 506 of mandrel 102. Side blocking bars 500 and 502 are elongate members that are a part of the alignment apparatus used to align flexible circuits 110 and 111, as well as other components, on mandrel 102.

Alignment pins 508 and 510 are configured for placement into channels 512 and 514 in side 504 of mandrel 102. Channels or holes are used to place alignment pins or to attach the alignment tool to mandrel 102. Pins are features, however, that do not have to be part of mandrel 102. Alignment pins 510 and 512 are used to align side blocking bar 500 to mandrel 102. Further, side blocking bar 500 includes screws 516 and 518, which are designed to fasten side blocking bar 500 to side 504 of mandrel 102 through the placement of screws 516 and 518 into threaded channels 520 and 522.

In a similar fashion, pins 524 and 526 are used to align side blocking bar 502 to side 506 of mandrel 102. In this example, pins 524 and 526 fit into channels 528 and 530 in side blocking bar 502. Screws 532 and 534 are used to secure side blocking bar 502 to side 506 of mandrel 102. These screws fit into threaded channels that are not shown on side 506 in this illustration.

Side blocking bar 500 and side blocking bar 502 are identical components in these examples. Surface 536 of side blocking bar 500 represents the opposite surface of side 536 for blocking bar 502. In a similar fashion, surface 536 represents the surface of side blocking bar 500 that is the opposite side of surface 536.

Figure 6:
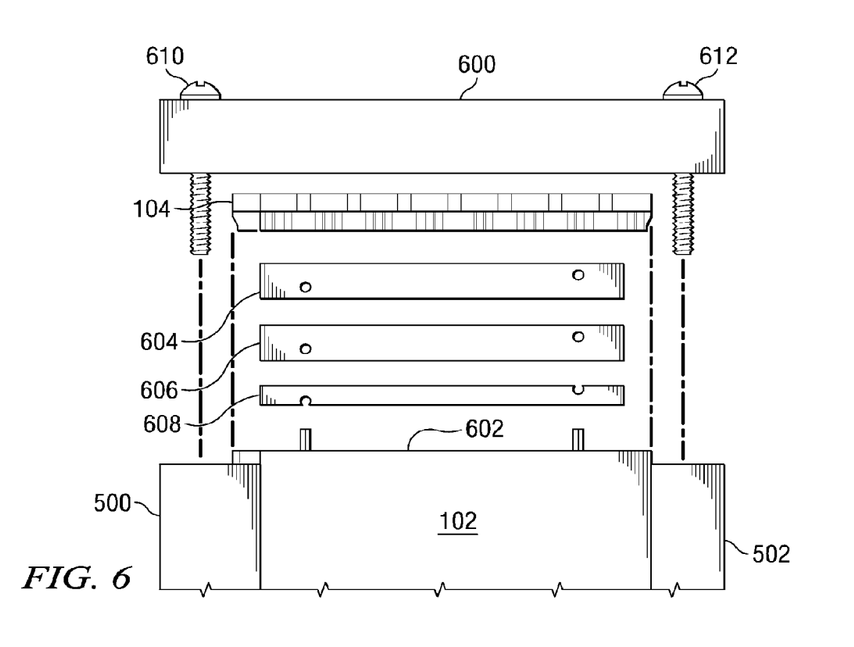
FIG. 6 is a diagram illustrating the alignment and placement of an antenna interface printing wiring board assembly in accordance with an advantageous embodiment.

Turning now to FIG. 6, a diagram illustrating the alignment and placement of an antenna interface printing wiring board assembly is depicted in accordance with an advantageous embodiment. In this example, top blocking bar 600 is used to align and attach antenna interface printed wiring board 104 onto side 602 of mandrel 102. Side 602, in this example, is a top side. Top blocking bar 600 is another component that is part of the alignment apparatus along with the side blocking bar 500 and side blocking bar 502. Preform 604, spacer 606, and preform 608 are used to provide spacing between air interface printed wiring board 104 and side 602 of mandrel 102. Screw 610 and 612 are used to fasten top blocking bar 600 to side 602 of mandrel 102.

Figure 7:
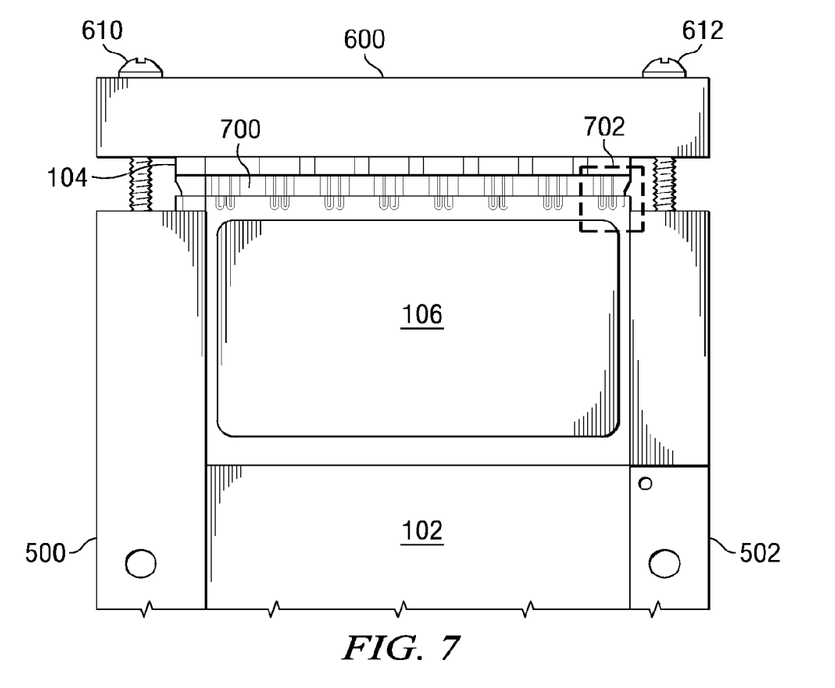
FIG. 7 is a diagram illustrating the placement of a ceramic package on a module using an alignment apparatus in accordance with an advantageous embodiment.

Turning now to FIG. 7, a diagram illustrating the placement of a ceramic package on a module using an alignment apparatus is depicted in accordance with an advantageous embodiment. In this example, ceramic package assembly 106 is placed between side blocking bar 500 and side blocking bar 502 below top blocking bar 600. Ceramic package assembly 106 is placed onto mandrel 102 and under flexible portion 700 of antenna interface printed wiring board 104.

In this manner, the pads that carry microwave signals on flexible portion 700 are aligned with the pads for ceramic package assembly 106. The alignment of these components are performed in these examples using the alignment apparatus, which includes side blocking bar 500, side blocking bar 502, and top blocking bar 600.

Figure 8:
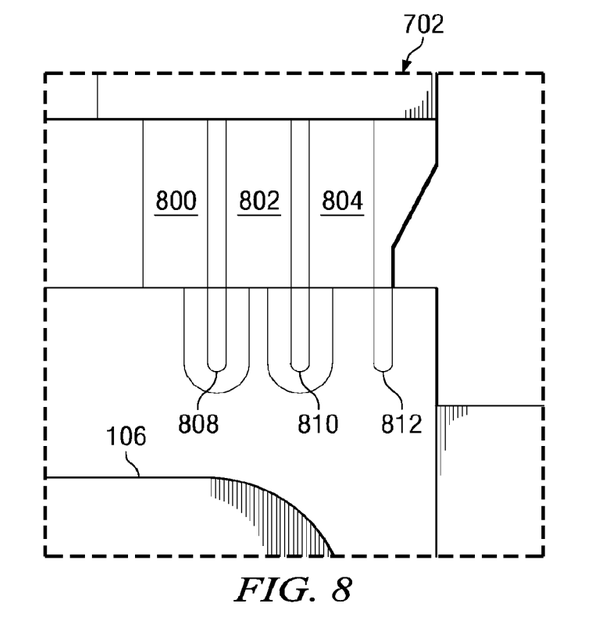
FIG. 8 is a more detailed illustration of an interconnect in accordance with an advantageous embodiment.

Turning now to FIG. 8, a more detailed illustration of section 702 in FIG. 7 is depicted in accordance with an advantageous embodiment. In this example, pads 800, 802, and 804 on flexible portion 700 align with pads 808, 810, and 812 on ceramic package assembly 106.

Figure 9A:
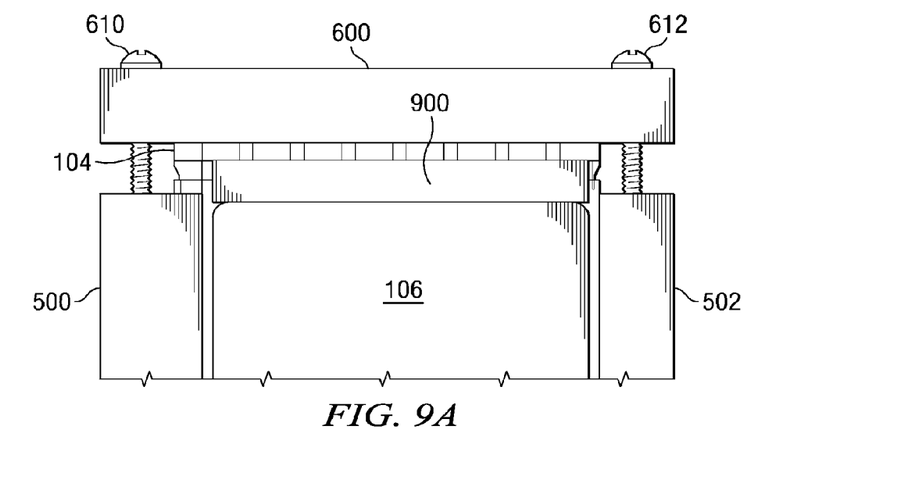
FIGS. 9A and 9B are diagrams illustrating additional portions of an alignment apparatus for use in aligning components to be attached to a module in accordance with an advantageous embodiment.
Figure 9B:
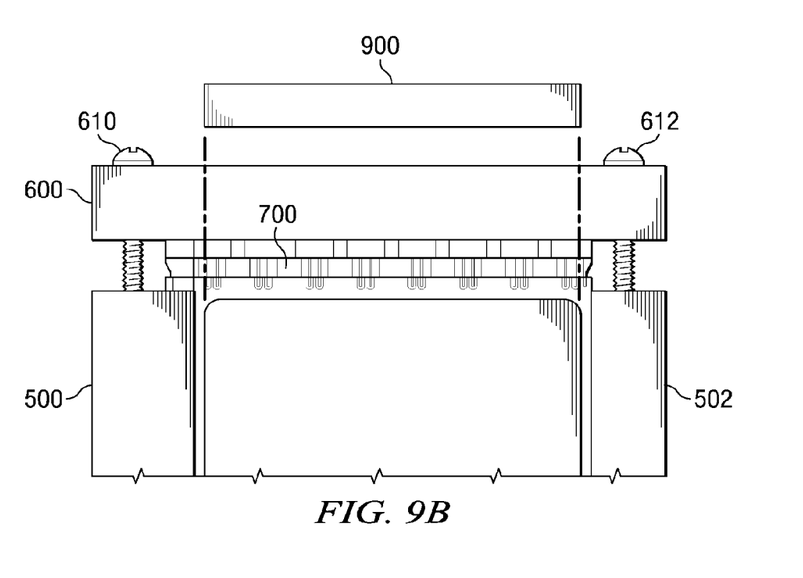

Turning now to FIGS. 9A and 9B, diagrams illustrating additional portions of an alignment apparatus for use in aligning components to be attached to a module are depicted in accordance with an advantageous embodiment. In this example, ceramic holding bar 900 is placed over flexible portion 700 between ceramic package assembly 106 and antenna interface printed wiring board 104.

Ceramic holding bar 900 is used to control the flexible ceramic package thickness in these examples. After these components have been put into place, ceramic holding bar 900 in ceramic package assembly 106 is held in place to prevent movement of ceramic package assembly 106 and antenna interface printing wiring board 104. Clamps may be used to hold these components in place in these examples.

Figure 10:
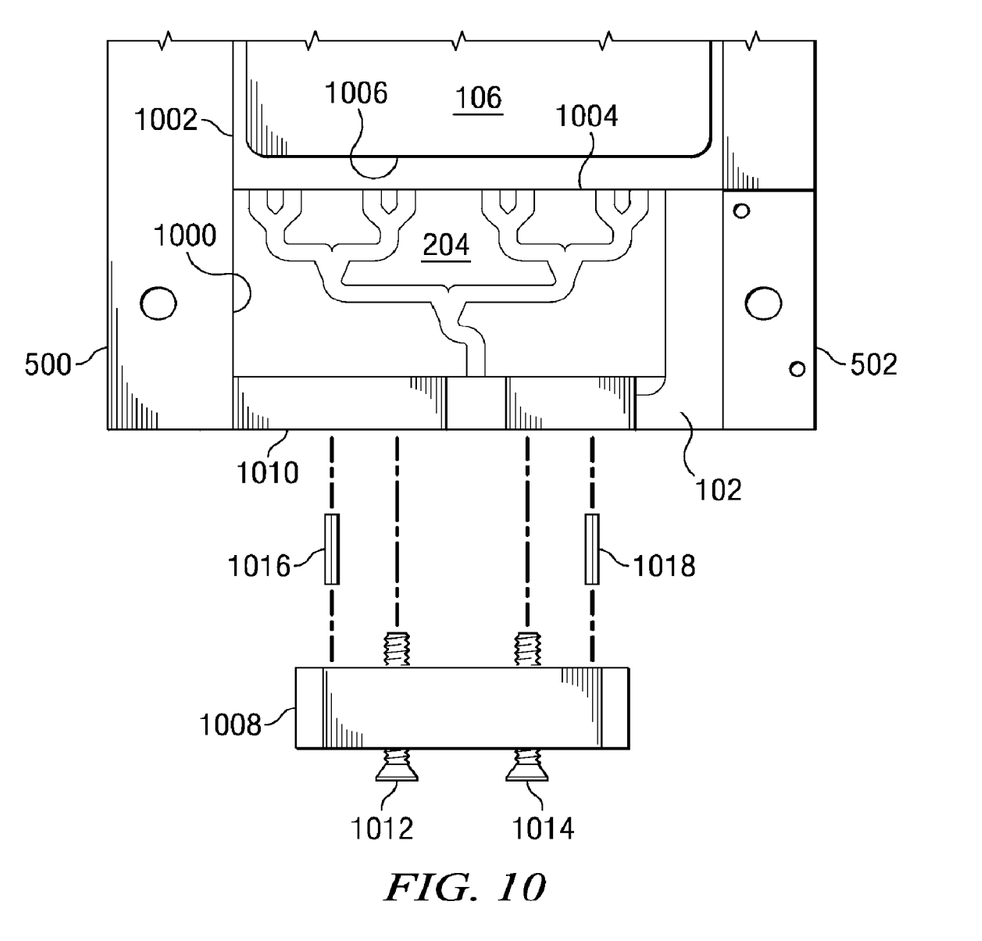
FIG. 10 is a diagram illustrating the alignment of a one to eight divider network in accordance with an advantageous embodiment.

Next, in FIG. 10 a diagram illustrating the alignment of a one to eight divider network is depicted in accordance with an advantageous embodiment. In FIG. 10, divider network 204 is placed onto mandrel 102. Divider network 204 is aligned by aligning edge 1000 of divider network 204 with side 1002 of side blocking bar 500. Edge 1004 of divider network 204 is aligned with edge 1006 of ceramic package assembly 106.

In this example, bottom blocking bar 1008 is attached to side 1010 of mandrel 102. Side 1010 is a bottom side in this example. Bottom blocking bar 1008 is fastened to side 1010 of mandrel 102 using screws 1012 and 1014, which fit into threaded channels (not shown) in mandrel 102. Bottom blocking bar 1008 is aligned with side 1010 of mandrel 102 through the use of pins 1016 and 1018.

Thus, in this manner, divider network 204 is aligned using the alignment apparatus. In this example, the alignment apparatus used to align divider network 204 includes side blocking bar 500, side blocking bar 502, and bottom blocking bar 1008. The alignment apparatus also includes top blocking bar 600. This component, however, is not used in aligning divider network 204.

Figure 11:
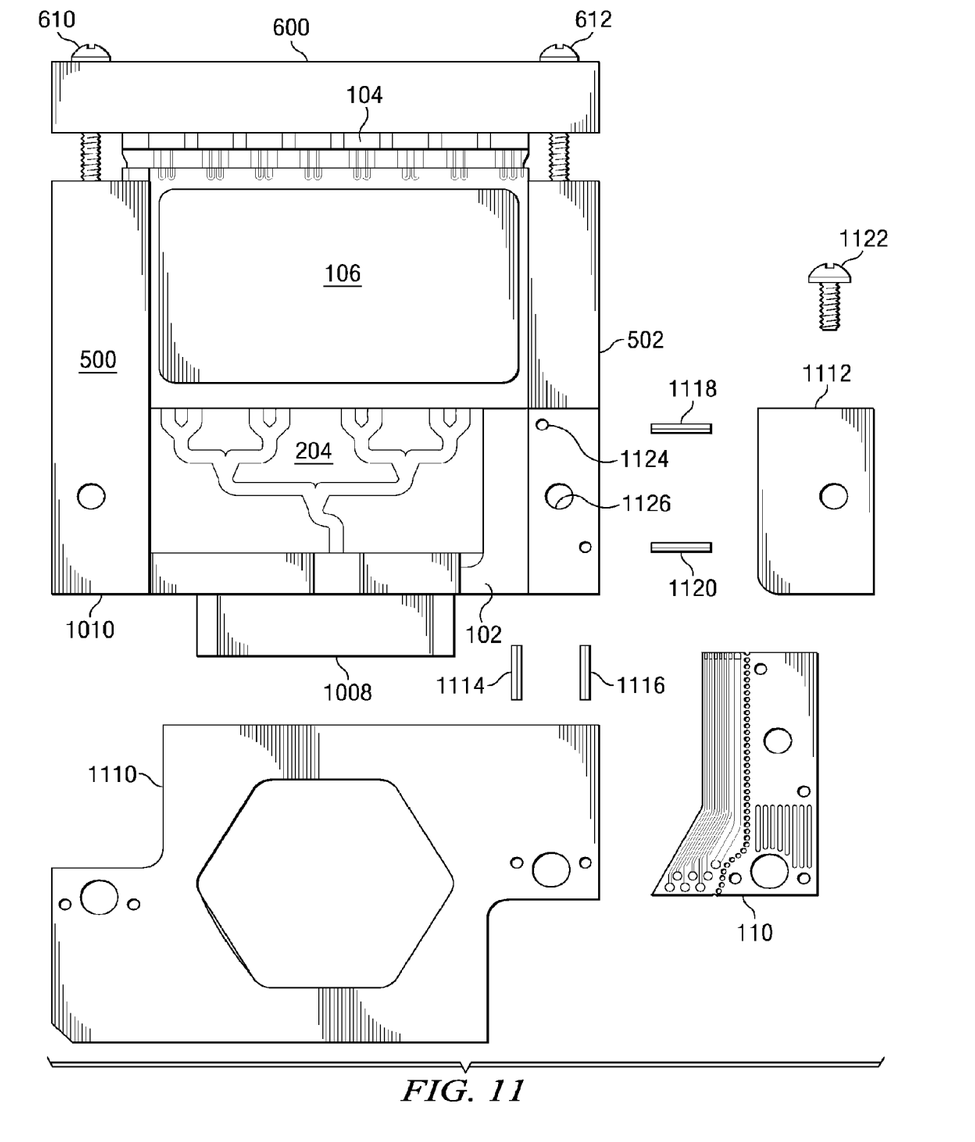
FIG. 11 is a diagram illustrating components used to align a flexible circuit in accordance with an advantageous embodiment.

With reference to FIG. 11, a diagram illustrating the components used to align a flexible circuit is depicted in accordance with an advantageous embodiment. In FIG. 11, bottom blocking bar 1008 is attached to side 1010 of mandrel 102. At this point, flexible circuit 110 is ready for alignment and attachment to mandrel 102 and the other components for module 100.

The components that are used to align flexible circuit 110 are flex bottom foot 1110 and flex front foot 1112. Additionally, pins 1114, 1116, 1118, and 1120 are used to align flexible circuit 110 in the appropriate place on mandrel 102. Additionally, screw 1122 is used to affix or attach flex front foot 1112 to mandrel 102.

These components are put into place after flexible circuit 110 is aligned on mandrel 102. In these examples, flex bottom foot 1110 and flex front foot 1112 are additional components that are part of the alignment apparatus. Holes 1124 and holes 1126 are alignment features found on side blocking bar 502. These alignment features are used in conjunction with the pins in the alignment features in flexible circuit 110 to align flexible circuit 110 in the desired position.

As can be seen, pins are not found on mandrel 102. Also, the pins that are used do not require alignment features, such as holes in the function section of flexible circuit 110.

Figure 12:
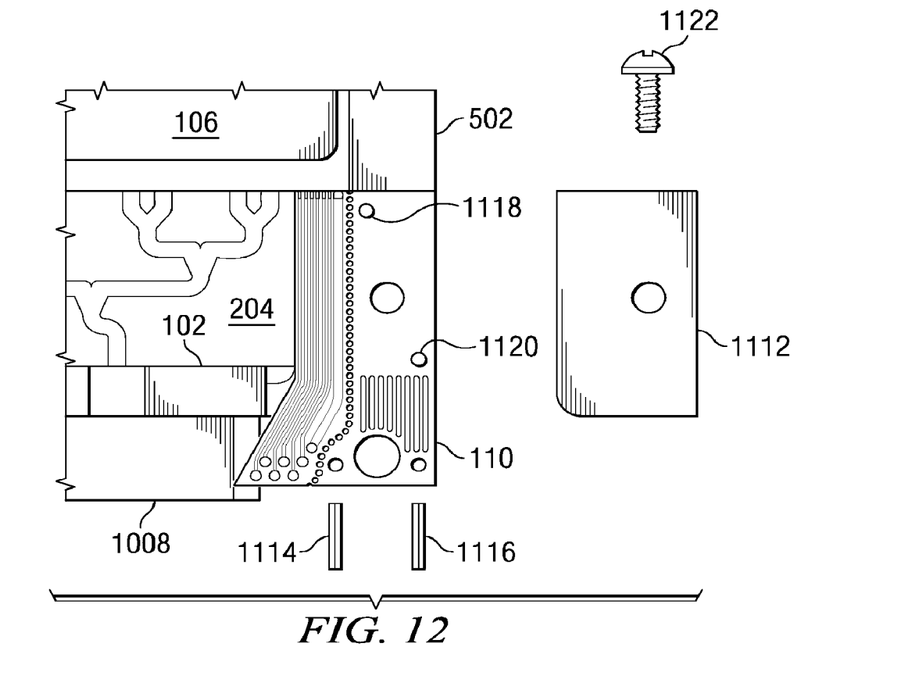
FIG. 12 is a diagram illustrating the placement of a flexible circuit using an alignment apparatus in accordance with an advantageous embodiment.

Turning to FIG. 12 a diagram illustrating the placement of a flexible circuit using an alignment apparatus is depicted in accordance with an advantageous embodiment. In this example, flexible circuit 110 has been placed onto mandrel 102. The alignment of flexible circuit 110 is performed using pins 1118 and 1120. Further, side blocking bar 502 and flex bottom foot 1110 also provide additional support in aligning flexible circuit 110 in the proper location and position on mandrel 102.

Figure 13:
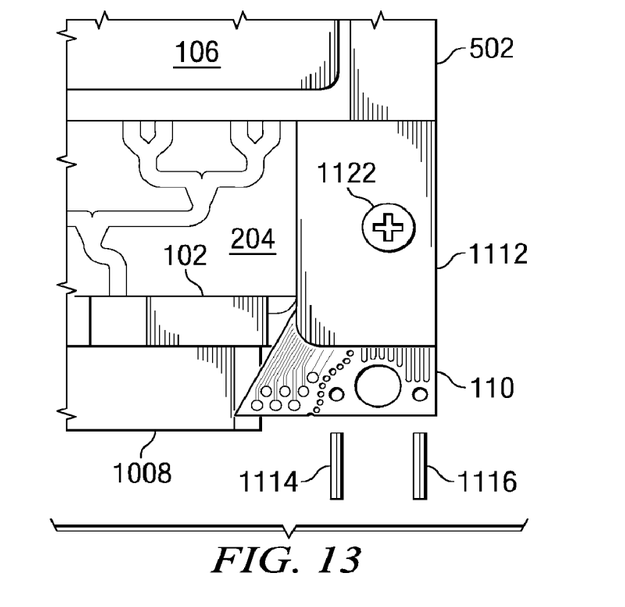
FIG. 13 is a diagram illustrating the securing of a flexible circuit to a mandrel in accordance with an advantageous embodiment.

Turning now to FIG. 13, a diagram illustrating the securing of a flexible circuit to a mandrel is depicted in accordance with an advantageous embodiment. In FIG. 13, flex front foot 1112 is secured to flexible circuit 110 with screw 1122, which is placed into a threaded channel in side blocking bar 502. The sacrificial portion of flexible circuit 110 lies over side blocking bar 502, while the functional section of circuit 110 lies over mandrel 102.

Figure 14:
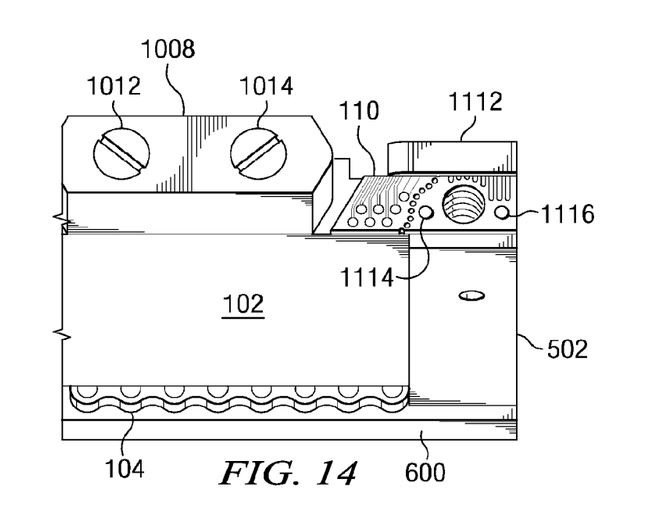
FIG. 14 is a diagram illustrating the curving of a flexible circuit using an alignment apparatus in accordance with an advantageous embodiment.

With reference now to FIG. 14, a diagram illustrating the curving of a flexible circuit using an alignment apparatus is depicted in accordance with an advantageous embodiment. In FIG. 14, pins 1114 and 1116 are used to hold flexible circuit 110 in a curved or bent position.

Figure 15:
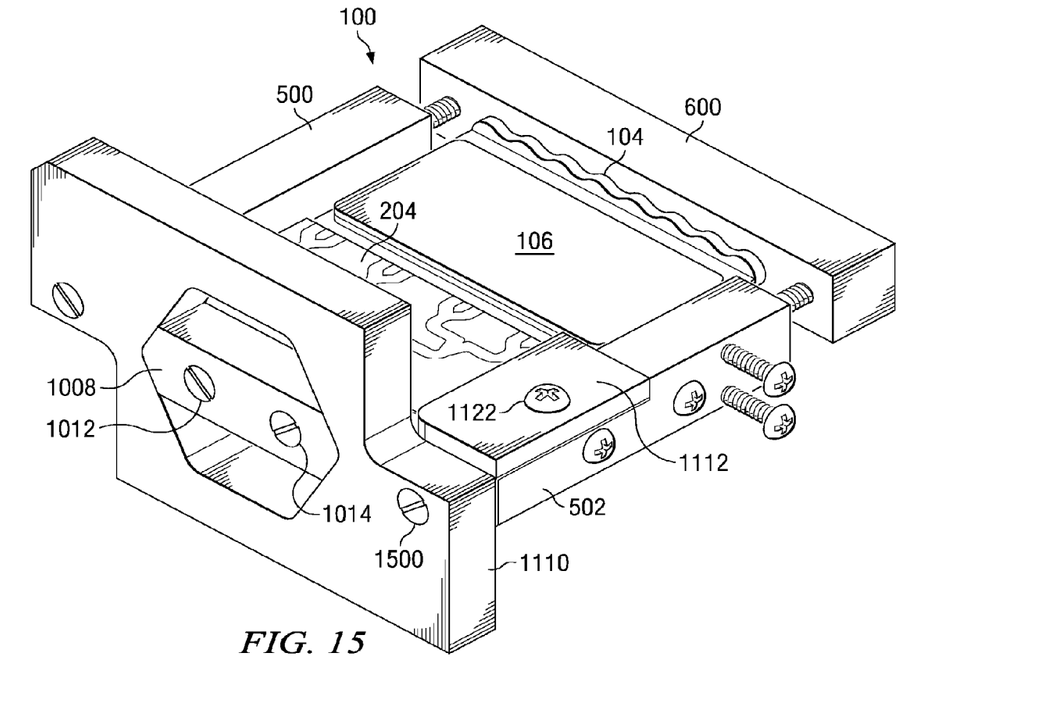
FIG. 15 is a diagram illustrating a complete assembly of components using an alignment apparatus in accordance with an advantageous embodiment.

Next in FIG. 15, a diagram illustrating a complete assembly of components using an alignment apparatus is depicted in accordance with an advantageous embodiment. In FIG. 15, flex bottom foot 1110 has been attached to the rest of the alignment apparatus using screw 1500. By affixing flex bottom foot 1110 to mandrel 102 and the rest of the alignment apparatus, flexible circuit 110 is held in place in the appropriate alignment and position. At this point, the adhesive on the back side of flexible circuit 110 may be cured such that flexible circuit 110 is now attached to mandrel 102 and aligned with the appropriate traces or contacts in the other components in module 100.

Figure 16:
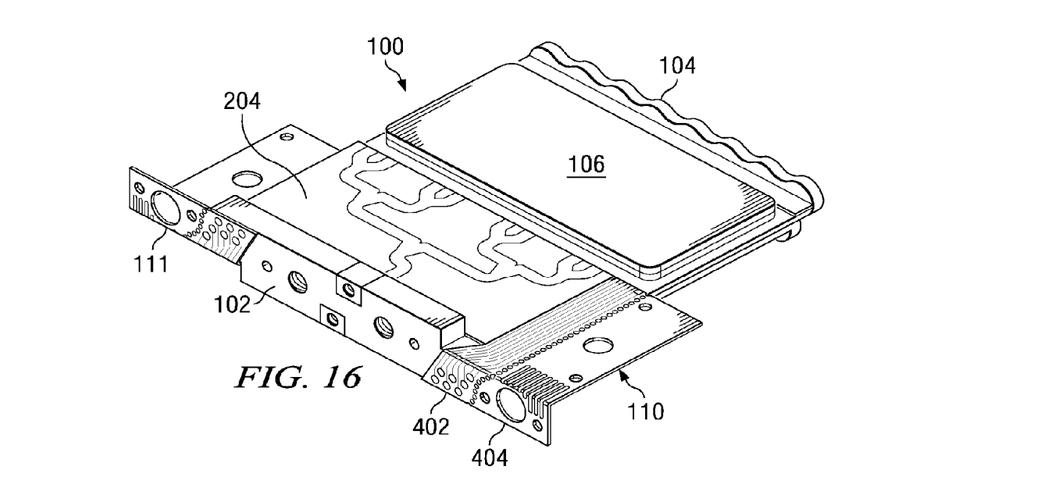
FIG. 16 is a completed assembly containing a flexible circuit in accordance with an advantageous embodiment.

In FIG. 16, a completed assembly containing flexible circuit 110 is depicted in accordance with an advantageous embodiment. Flexible circuit 110 has been cured and is now in place. In this example, sacrificial portion 404 has not yet been removed from functional section 402 in flexible circuit 110. As can be seen, flexible circuit 111 also is attached to the opposite side of mandrel 102 from flexible circuit 110. Although not shown in the figures above, flexible circuit 111 is attached in the same manner as flexible circuit 110 through alignment features and pins used with side blocking bar 500. When sacrificial portion 404 are removed from flexible circuits 110 and 111, module 100 is complete in this particular example.

Figure 17:
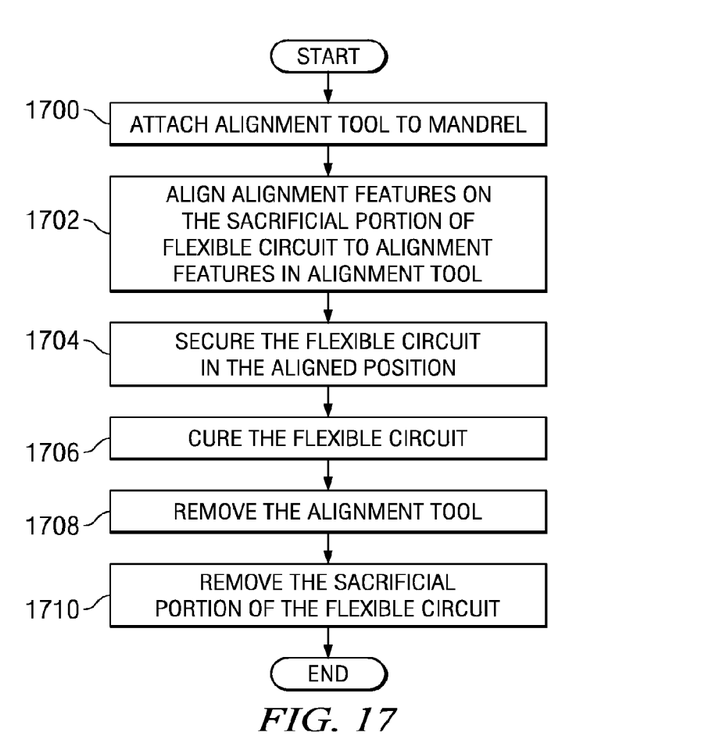
FIG. 17 a flowchart of a process for attaching a flexible circuit to a module in accordance with an advantageous embodiment.

Turning now to FIG. 17, a flowchart of a process for attaching a flexible circuit to a module is depicted in accordance with an advantageous embodiment. The process begins by attaching an alignment tool to a mandrel (operation 1700). In these examples, the alignment tool includes different blocking bars.

Thereafter, alignment features in the sacrificial portion of the flexible circuit are aligned to alignment features in the alignment tool (operation 1702). In these examples, the different features are holes in the sacrificial portion of the flexible circuit. Pins are placed through these holes in the sacrificial portion of the flexible circuit and are placed through holes in the alignment tool to align the flexible circuit in operation 1702.

Afterwards, the flexible circuit is secured in the aligned position (operation 1704). In these examples, the securing of the flexible circuit is performed by securing footers to the alignment tool. Next, the flexible circuit is cured (operation 1706). The curing is performed such that the adhesive bonds the flexible circuit to the mandrel. Thereafter, the alignment tool is removed (operation 1708). The sacrificial portion of the flexible circuit is then removed with the functional portion of the flexible circuit attached or bonded to the mandrel (operation 1710) with the process terminating thereafter.

In this manner, the different advantageous embodiments provide an alignment apparatus that may be used to install a flexible circuit onto a module with tight positional tolerances without the inclusion of alignment pins in the structural component of a module, such as a mandrel.

Some of the different advantageous features in these illustrative embodiments are provided through the use of sacrificial sections in the flexible circuit that contains alignment features. In the depicted examples, the alignment features are holes that correspond to alignment pins used in the alignment apparatus. Further, the backside of the flexible circuit has an adhesive in a paste form that allows for the flexible circuit to be placed and aligned on the mandrel.

The flexible circuit is aligned using pins in the alignment apparatus in which holes are present in the sacrificial section of the flexible circuit for aligning the flexible circuit properly on the mandrel. The sacrificial section of the flexible circuit is removed after the flexible circuit has been secured and the adhesive has been cured to form a bond between the flexible circuit and the mandrel. Other types of alignment features may be used in the sacrificial section of the flexible circuit other than the ones illustrated in the depicted examples. Other types and numbers of geometric features may be used depending on the implementation.

The description of the present invention has been presented for purposes of illustration and description, and is not intended to be exhaustive or limited to the invention in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the invention, the practical application, and to enable others of ordinary skill in the art to understand the invention for various embodiments with various modifications as are suited to the particular use contemplated.

What is claimed is:

1. A method for attaching a flexible circuit to a structure, the method comprising:

aligning a first feature in a functional section of the flexible circuit on a mandrel to a second feature on the structure using a sacrificial section in the flexible circuit to align the first feature to the second feature, wherein the flexible circuit is in an aligned position, the sacrificial section comprising a bottom blocking bar, the bottom blocking bar removably fastened to a bottom side of the mandrel;

attaching an alignment apparatus to the structure;

aligning an alignment feature on the sacrificial section to an alignment feature on the alignment apparatus to align the first feature to the second feature, wherein the flexible circuit is in the aligned position;

attaching the flexible circuit to the structure while the flexible circuit is in the aligned position; and removing the sacrificial section of the flexible circuit.

2. The method of claim 1, wherein a bottom side of the flexible circuit in contact with the structure has an adhesive and wherein the attaching step comprises:

curing the adhesive such that the flexible circuit is attached to the structure.

3. The method of claim 1, wherein the first feature is a plurality of circuit pads and wherein the second feature is a second plurality of circuit pads on a circuit on the mandrel.

4. The method of claim 1 further comprising:

aligning a non-flexible component on the structure using the alignment apparatus.

5. A flexible circuit configured to engage a mandrel, the flexible circuit comprising:

a functional section, the functional section including a plurality of trace lines, a first plurality of circuit pads at a first end of the plurality of trace lines, and a second plurality of circuit pads at a second end of the plurality of trace lines; and a sacrificial section having a set of alignment features comprising a number of members, each member temporarily attached to the functional section, one of the number of members comprising a bottom blocking bar, the bottom blocking bar removably fastened to a bottom side of the mandrel.

6. The flexible circuit of claim 5 further comprising:

an adhesive located on a bottom side of the functional section.

7. An apparatus for attaching a flexible circuit to a structure, the apparatus comprising:

a number of members, each member being temporarily fastened to a mandrel of the structure and having alignment features comprising holes, pins, and screws that are used to align and attach the flexible circuit onto the mandrel, the flexible circuit comprising:
a functional portion comprising circuit pads, wherein a back side of the functional portion is cured to the mandrel, and wherein the functional portion lacks alignment features; and
a sacrificial portion comprising a number of alignment holes to align the flexible circuit with the apparatus that can be removed after the functional portion is cured onto the mandrel; and
an adhesive to cure the functional portion of the flexible circuit onto the mandrel after the flexible circuit is aligned, wherein the members are removed after the functional portion is cured onto the mandrel,
one of the number of members comprising a bottom blocking bar that is temporarily fastened to a bottom side of the mandrel to align a divider network onto the mandrel.

8. The apparatus of claim 7, wherein the number of members comprise:
a side blocking bar that is temporarily fastened to a lateral side of the mandrel, the holes and pins of the side blocking bar used to align the flexible circuit onto the mandrel;
a flex bottom foot for providing additional support for aligning flexible circuit, the flex bottom foot being temporarily screwed to the bottom side of the bottom blocking bar; and
a flex front foot for attaching the flexible circuit to the mandrel while the adhesive cures the flexible circuit onto the mandrel.

9. The apparatus of claim 7, wherein the number of members further comprises:
a top blocking bar that is temporarily attached above a top side of the mandrel for aligning and attaching an antenna interface printed wiring board to the top side of the mandrel.

10. The apparatus of claim 8, wherein the flex bottom foot is used to hold the flexible circuit in one of a curved position and a bent position.

11. The apparatus of claim 9, wherein a ceramic package assembly is aligned and placed onto the mandrel below the top blocking bar and next to the side blocking bar, the ceramic package assembly comprising a number of microelectronic components.

12. The apparatus of claim 7, wherein the mandrel lacks alignment features for aligning the flexible circuit.

13. The method of claim 1, wherein the functional section of the flexible circuit lacks alignment features.

14. The method of claim 1, wherein in the aligned position a back side of the functional section abuts the mandrel.

15. The method of claim 14, further comprising curing the back side of the flexible circuit to the mandrel using an adhesive; and removing the sacrificial section of the flexible circuit after curing the adhesive on the back side of functional section of the flexible circuit to the mandrel while the flexible circuit is in the aligned position.

\* \* \* \* \*